(12) United States Patent
Iwata

(10) Patent No.: US 10,451,775 B2
(45) Date of Patent: Oct. 22, 2019

(54) SOLID-STATE IMAGING DEVICE, PRODUCTION METHOD, AND ELECTRONIC APPARATUS

(71) Applicant: SONY CORPORATION, Tokyo (JP)

(72) Inventor: Hikaru Iwata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/311,921

(22) PCT Filed: May 20, 2015

(86) PCT No.: PCT/JP2015/064405
§ 371 (c)(1),
(2) Date: Nov. 17, 2016

(87) PCT Pub. No.: WO2015/186512
PCT Pub. Date: Dec. 10, 2015

(65) Prior Publication Data
US 2017/0090075 A1   Mar. 30, 2017

(30) Foreign Application Priority Data

Jun. 3, 2014   (JP) .................................. 2014-114629

(51) Int. Cl.
*G02B 3/00* (2006.01)
*H01L 27/14* (2006.01)
(Continued)

(52) U.S. Cl.
CPC .......... *G02B 3/0075* (2013.01); *G02B 3/0056* (2013.01); *G02B 3/0068* (2013.01);
(Continued)

(58) Field of Classification Search
CPC ......... H01L 27/14621; H01L 27/14627; H01L 27/14636; H01L 27/14645;
(Continued)

(56) References Cited

U.S. PATENT DOCUMENTS

| 7,701,636 B2 * | 4/2010 | Boettiger ......... B29D 11/00365 |
| | | 359/620 |
| 2002/0050603 A1 * | 5/2002 | Kawamoto ......... H01L 27/0647 |
| | | 257/175 |

(Continued)

FOREIGN PATENT DOCUMENTS

| JP | 4-223371 A | 8/1992 |
| JP | 2008-214495 A | 9/2008 |

(Continued)

OTHER PUBLICATIONS

International Search Report prepared by the Japan Patent Office dated Jul. 8, 2015, for International Application No. PCT/JP2015/064405.

*Primary Examiner* — Dale E Page
*Assistant Examiner* — Quovaunda Jefferson
(74) *Attorney, Agent, or Firm* — Sheridan Ross P.C.

(57) ABSTRACT

The present technology relates to a solid-state imaging device, a production method, and an electronic apparatus that can prevent sensitivity unevenness from generating. The solid-state imaging device includes a pixel array unit having a plurality of pixels, a microlens formed by laminating a plurality of lens layers for the every pixel, and a film formed between the lens layers with a uniform film thickness having a refractive index lower than a refractive index of the lens layer. The present technology is applicable to an amplification type solid-state imaging device such as a surface irradiation type or rear irradiation type CMOS image sensor, and a charge transfer type solid-state imaging device such as a CCD image sensor.

9 Claims, 11 Drawing Sheets

(51) Int. Cl.
*H04N 5/369* (2011.01)
*H01L 27/146* (2006.01)

(52) U.S. Cl.
CPC ........ *H01L 27/14* (2013.01); *H01L 27/14621* (2013.01); *H01L 27/14627* (2013.01); *H01L 27/14636* (2013.01); *H01L 27/14645* (2013.01); *H01L 27/14685* (2013.01); *H04N 5/369* (2013.01)

(58) Field of Classification Search
CPC    H01L 27/14685; H04N 5/369; G02B 3/0056; G02B 3/0068
See application file for complete search history.

(56) References Cited

U.S. PATENT DOCUMENTS

| | | | | |
|---|---|---|---|---|
| 2006/0061674 | A1* | 3/2006 | Iida | H01L 27/14621 348/308 |
| 2008/0042227 | A1* | 2/2008 | Asano | H01L 27/14618 257/432 |
| 2009/0147101 | A1* | 6/2009 | Tatani | H01L 27/14621 348/224.1 |
| 2009/0190009 | A1* | 7/2009 | Kawasaki | H01L 27/14618 348/249 |

FOREIGN PATENT DOCUMENTS

| | | |
|---|---|---|
| JP | 2009-177079 A | 8/2009 |
| JP | 2013-077740 | 4/2013 |

* cited by examiner

SOLID-STATE IMAGING DEVICE, PRODUCTION METHOD, AND ELECTRONIC APPARATUS

CROSS REFERENCE TO RELATED APPLICATIONS

This application is a national stage application under 35 U.S.C. 371 and claims the benefit of PCT Application No PCT/JP2015/064405 having an international filing date of 20 May 2015, which designated the United States, which PCT application claimed the benefit of Japanese Patent Application No. 2014-114629 filed 3 Jun. 2014, the disclosures of which are incorporated herein by reference in their entirety.

TECHNICAL FIELD

The present technology relates to a solid-state imaging device, a production method, and an electronic apparatus, and in particularly to a solid-state imaging device, a production method, and an electronic apparatus that prevent sensitivity unevenness from generating.

BACKGROUND ART

In a solid-state imaging device in the related art, there is known a microlens formed by a plurality of lens layers in order to optimize a curvature and a refractive index of a microlens in each pixel (see Patent Document 1, for example).

Patent Document 1: Japanese Patent Application Laid-open No. 2013-77740

SUMMARY

Problem to be Solved

However, in the solid-state imaging device described in Patent Document 1, an oxide film may be formed between lens layers by a process of a microlens formation. The oxide film is not formed uniformly between the lens layers, and may be formed or not depending on places. Accordingly, sensitivity unevenness may be generated in whole pixels.

The present technology is made in view of the circumstances, and prevents sensitivity unevenness from generating.

Means for Solving the Problem

A solid-state imaging device according to an aspect of the present technology includes a pixel array unit having a plurality of pixels; a microlens formed by laminating a plurality of lens layers for the every pixel; and a film having a uniform film thickness formed between the lens layers.

The film may be an oxide film.

The film may have a refractive index lower than a refractive index of the lens layer.

The lens layer may be formed of an inorganic material.

The lens layer may be formed of SiN.

Among the plurality of lens layers, a lower layer, i.e., a first lens layer may be formed of SiN, and an upper layer, i.e., a second lens layer may be formed of SiON.

Among the plurality of lens layers, a lower layer, i.e., a first lens layer may be formed of an inorganic material, and an upper layer, i.e., a second lens layer may be formed of an organic material.

A method of producing a solid-state imaging device including a pixel array unit having a plurality of pixels according to an aspect of the present technology includes the steps of: forming a microlens by laminating a plurality of lens layers for the every pixel; and forming a film having a uniform film thickness between the lens layers.

An electronic apparatus according to an aspect of the present technology includes a solid-state imaging device including a pixel array unit having a plurality of pixels; a microlens formed by laminating a plurality of lens layers for the every pixel; and a film having a uniform film thickness formed between the lens layers.

According to an aspect of the present technology, a microlens is formed by laminating a plurality of lens layers for every pixel, and a film having a uniform film thickness is formed between lens layers.

Effects

According to an aspect of the present technology, it is possible to prevent sensitivity unevenness from generating.

DESCRIPTION OF PREFERRED EMBODIMENTS

Hereinafter, the embodiments of the present technology will be described referring to drawings.

<Configuration Example of Solid-State Imaging Device>

Figure 1:
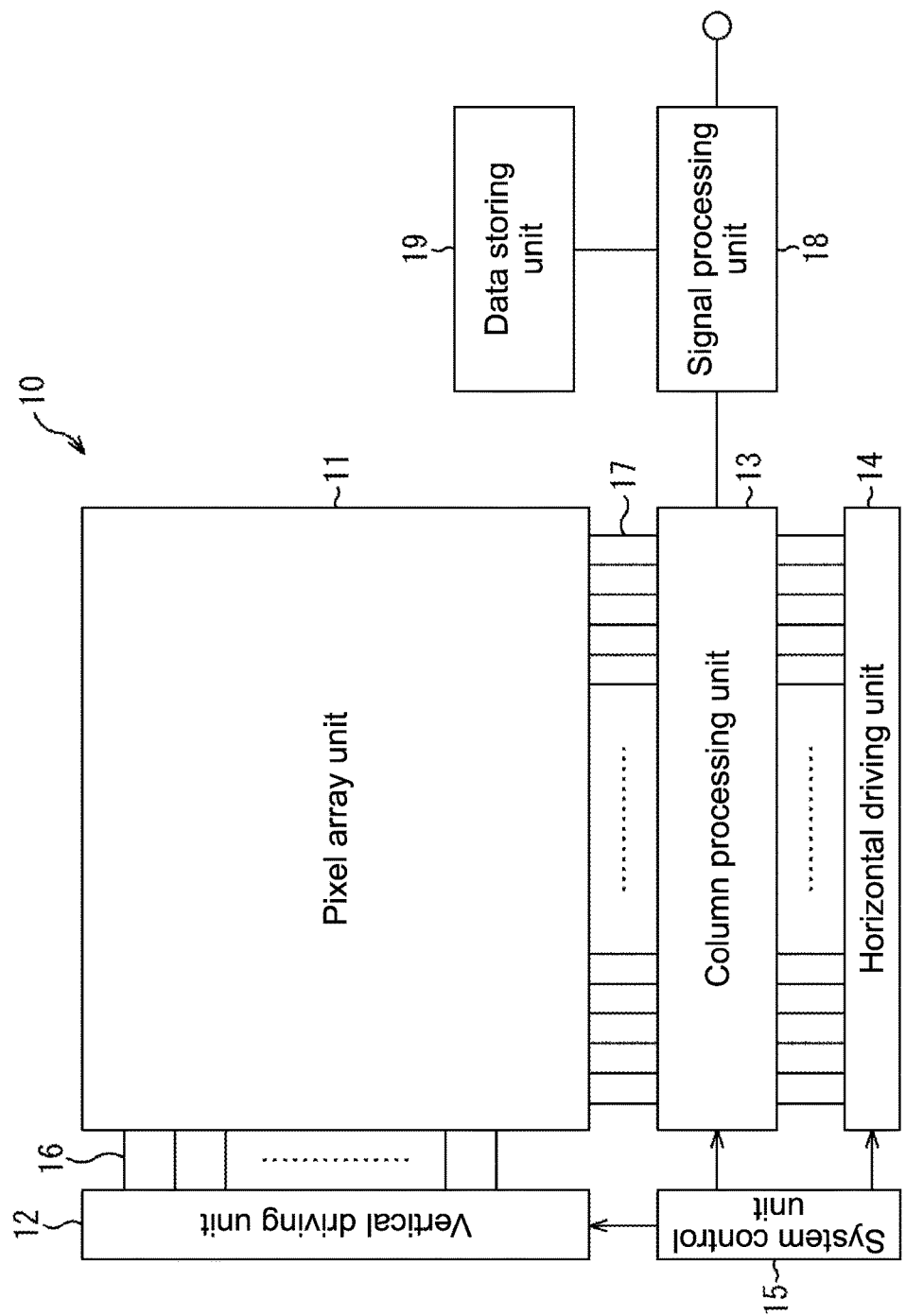
FIG. 1 is a block diagram showing a configuration example of a solid-state imaging device to which the present technology is applied.

FIG. 1 a block diagram showing a configuration which the present technology is applied. Hereinafter, a configuration of a surface irradiation type CMOS (Complementary Metal Oxide Semiconductor) image sensor that is one of amplification type solid-state imaging devices will be described.

The present technology is not limited to be applied to the surface irradiation type CMOS image sensor, and is applicable to a rear irradiation type CMOS image sensor, other amplification type solid-state imaging device, and a charge transfer type solid-state imaging device such as a CCD (Charge Coupled Device) image sensor.

A CMOS image sensor 10 shown in FIG. 1 has a configuration that includes a pixel array unit 11 formed on a semiconductor substrate (not shown), and peripheral circuit units integrated on the same semiconductor substrate of the pixel array unit 11. The peripheral circuit units are configured of, for example, a vertical driving unit 12, a column processing unit 13, a horizontal driving unit 14, and a system control unit 15.

Furthermore, the CMOS image sensor 10 includes a signal processing unit 18 and a data storing unit 19.

The pixel array unit 11 includes a plurality of unit pixels that generate light electrical charge corresponding to a received light amount and have photoelectric conversion units for accumulation (hereinafter referred to simply as pixels). Specifically, the pixel array unit 11 has a configuration that the pixels are two-dimensionally arranged in a row direction and a column direction, i.e., in a matrix. Here, the row direction represents an arrangement direction (horizontal direction) of pixels in a pixel row, and the column direction represents an arrangement direction (vertical direction) of pixels in a pixel column.

In the matrix pixel arrangement of the pixel array unit 11, a pixel driving line 16 is wired along the row direction for every pixel row, and a vertical signal line 17 is wired along the column direction for every pixel column. The pixel driving line 16 transmits a driving signal for driving when a signal is read-out from the pixel. In FIG. 1, the pixel driving line 16 is shown in one wire, but is not limited to one. One end of the pixel driving line 16 is connected to an output end corresponding to each column of the vertical driving unit 12.

The vertical driving unit 12 is configured of a shift resistor and an address decoder, and drives each pixel of the pixel array unit 11 at the same time or in a row unit. In other words, the vertical driving unit 12 configures a driving unit that drives each pixel of the pixel array unit 11 together with the system control unit 15 that controls the vertical driving unit 12. The vertical driving unit 12 typically has two scanning systems of a read-out scanning system and a sweep scanning system, although specific configuration thereof is not shown.

The read-out scanning system selectively scans a unit pixel of the pixel array unit 11 in a row unit in order to read-out a signal from the unit pixel. The signal read out from the unit pixel is an analog signal. The sweep scanning system sweep-scans before the read-out scanning by a shutter speed time period for a read-out row that is read-out scanned by the read-out scanning system.

As the sweep scanning system sweep-scans to sweep unnecessary charges from photoelectric conversion units of the unit pixel in the read-out row. By sweeping (resetting) the unnecessary charges by the sweep scanning system, an electronic shutter operation is performed. Here, the electronic shutter operation refers to an operation that light electrical charge in the photoelectric conversion units are discarded, and exposure is newly started (accumulation of the light electrical charge is started).

The signal read out by a read-out operation of the read-out scanning system corresponds to a received light amount directly before the read-out operation or after the electronic shutter operation. Then, a period from a read-out timing by the read-out operation directly before or a sweep-out timing by the electronic shutter to a read-out timing by the read-out operation this time is an exposure period of light electrical charge in the unit pixel.

A signal output from each unit pixel in the pixel row selectively scanned by the vertical driving unit 12 is input to the column processing unit 13 through each of the vertical signal lines 17 for every pixel column. The column processing unit 13 performs predetermined signal processing to a signal output through the vertical signal line 17 from each pixel in a selected row for every pixel column of the pixel array unit 11, and holds temporarily the pixel signal after the signal processing.

Specifically, the column processing unit 13 performs, as the signal processing, at least noise removal processing, for example, CDS (Correlated Double Sampling) processing. Through the CDS processing by the column processing unit 13, a fixed pattern noise specific to the pixel such as reset noise and a threshold value variation of an amplifying transistor within the pixel is removed. The column processing unit 13 may have an AD (Analog-Digital) converting function other than the noise removal processing, whereby an analog pixel signal may be converted into a digital signal to be output.

The horizontal driving unit 14 is configured of a shift resistor, an address decoder, or the like, and sequentially selects the unit circuit corresponding to the pixel column of the column processing unit 13. Through the selective scanning by the horizontal driving unit 14, the pixel signal that is subjected to the signal processing for every unit circuit in the column processing unit 13 is sequentially output.

The system control unit 15 is configured of a timing generator that generates a variety of timing signals. On the basis of a variety of timing signals generated by the timing generator, the system control unit 15 performs a driving control of the vertical driving unit 12, the column processing unit 13, the horizontal driving unit 14 and the like.

The signal processing unit 18 has at least an arithmetic processing function, and performs a variety of signal processing such as arithmetic processing to the pixel signal output from the column processing unit 13. The data storing unit 19 temporarily stores data necessary for the signal processing at the signal processing unit 18.

The signal processing unit 18 and the data storing unit 19 may be mounted on the same substrate (semiconductor substrate) of the CMOS image sensor 10, or may be mounted on a separate substrate from the CMOS image sensor 10. In addition, each processing by the signal processing unit 18 and the data storing unit 19 may be executed as the processing by an external signal processing unit mounted on a separate substrate from the CMOS image sensor 10, for example, a DSP (Digital Signal Processor) circuit or software.

Furthermore, when the CMOS image sensor 10 is a rear irradiation type CMOS image sensor, the CMOS image sensor 10 may be configured as a lamination type CMOS image sensor where the semiconductor substrate including the pixel array unit 11 is adhered to the semiconductor substrate including the logic circuit.

<Solid-State Imaging Device in Related Art>

In the related art, a microlens is formed by laminating a plurality of lens layers in the solid-state imaging device in order to optimize a curvature and a refractive index of a microlens in each pixel.

Figure 2:
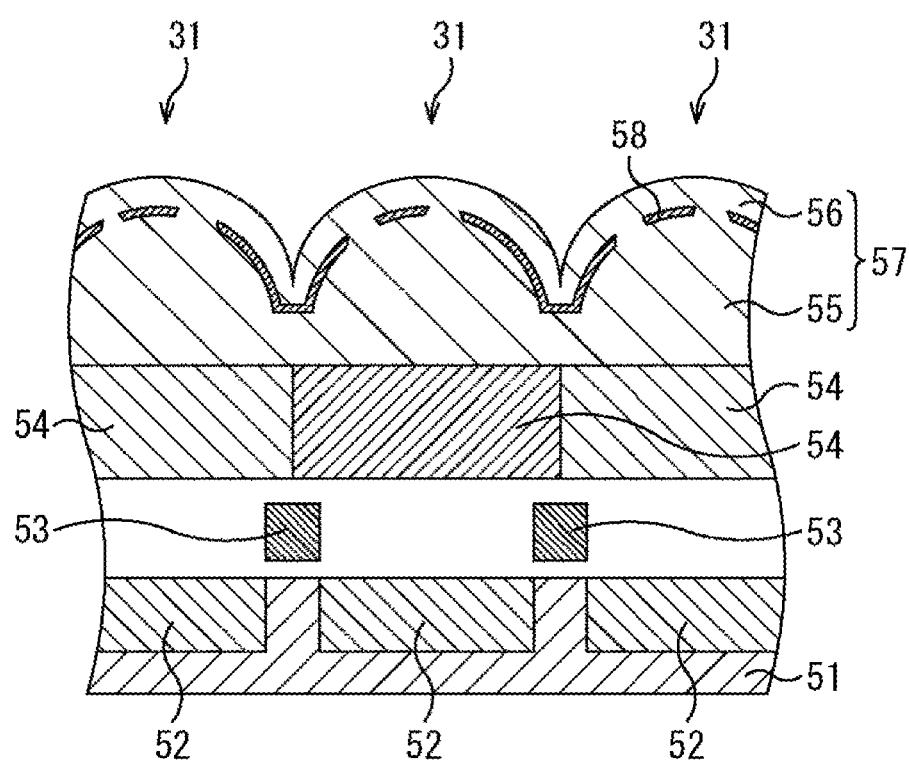
FIG. 2 is a view for illustrating an oxide film formed in a solid-state imaging device in the related art.

FIG. 2 is a cross-sectional view showing a configuration example of pixels in a solid-state imaging device in the related art including microlenses formed by laminating a plurality of lens layers.

As shown in FIG. 2, a photoelectric conversion unit 52 that receives incident light and performs photoelectric conversion is formed on a semiconductor substrate 51 in a pixel 31, and a wiring layer 53 is formed on an upper layer of the semiconductor substrate 51.

Above the wiring layer 53, a color filter layer 54 having spectral characteristics corresponding to each pixel 31 is formed for the every pixel 31, and microlenses 57 are formed over the color filter layer 54 by laminating a first lens layer 55 and a second lens layer 56.

Furthermore, in the solid-state imaging device shown in FIG. 2, an oxide film 58 is formed between the first lens layer 55 and the second lens layer 56 by a microlens formation process. The oxide film 58 is not uniformly formed between the first lens layer 55 and the second lens layer 56, and may be formed or not depending on places. Accordingly, sensitivity unevenness may be generated in whole pixels.

Figure 3:
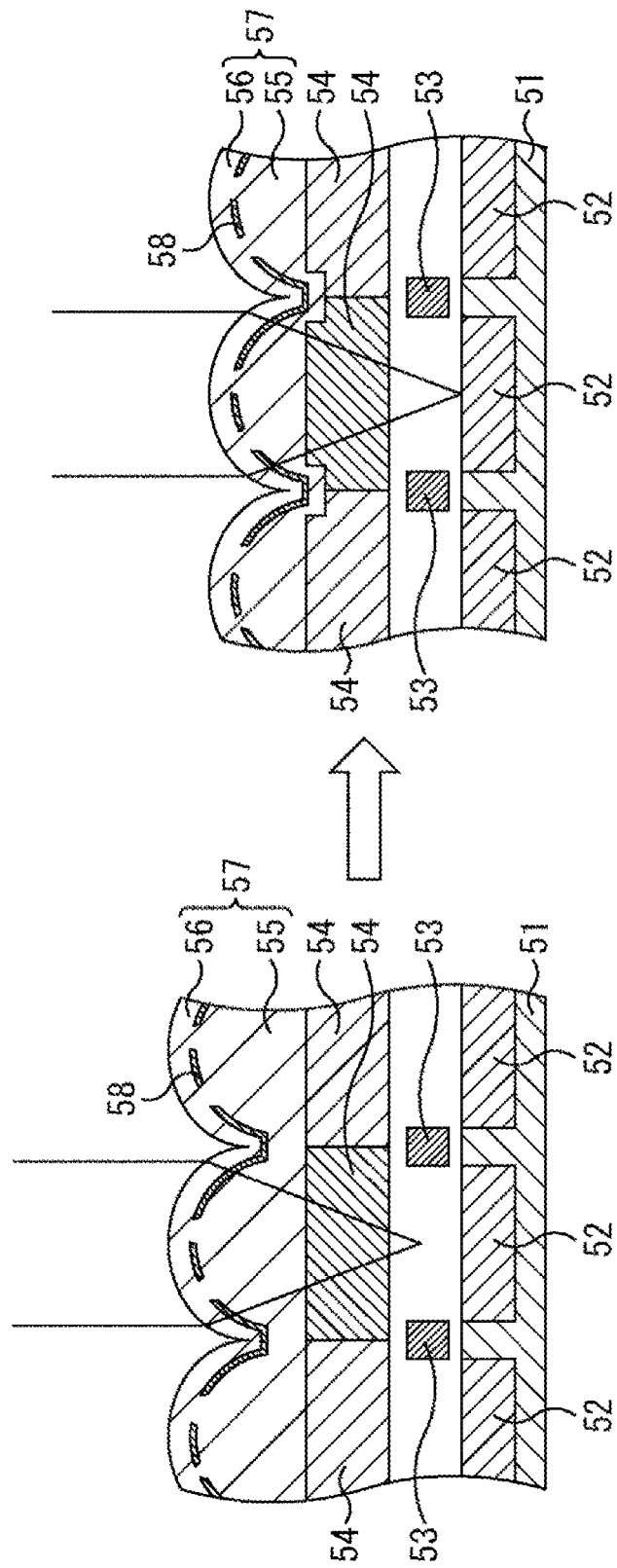
FIG. 3 are views for illustrating light-concentrating points in solid-state imaging devices in the related art.

Also, in the related art, when a light-concentrating point of the incident light from the microlens 57 is above a light receiving surface of the photoelectric conversion unit 52 (so-called front focus state) in the solid-state imaging device, as shown in a left view of FIG. 3, the height of the microlens 57 can be typically reduced.

However, when the height of the microlens 57 is tried to be reduced, a part of the color filter layer 54 may be scraped at parts where the microlenses 57 of the respective pixels are adjacent by the first lens layer 55 during etching upon the formation of the first lens layer 55. That is to say, in the solid-state imaging device including the microlenses formed by laminating the plurality of lens layers, when it falls into the front focus state, it is difficult to match the light-concentrating point with the light receiving surface of the photoelectric conversion unit 52.

Then, it describes below that the light-concentrating point can be matched with the light receiving surface of the photoelectric conversion unit 52 even when it falls into the front focus state, while it prevents sensitivity unevenness from generating in whole pixels.

<Configuration Example of Pixels According to First Embodiment>

Figure 4:
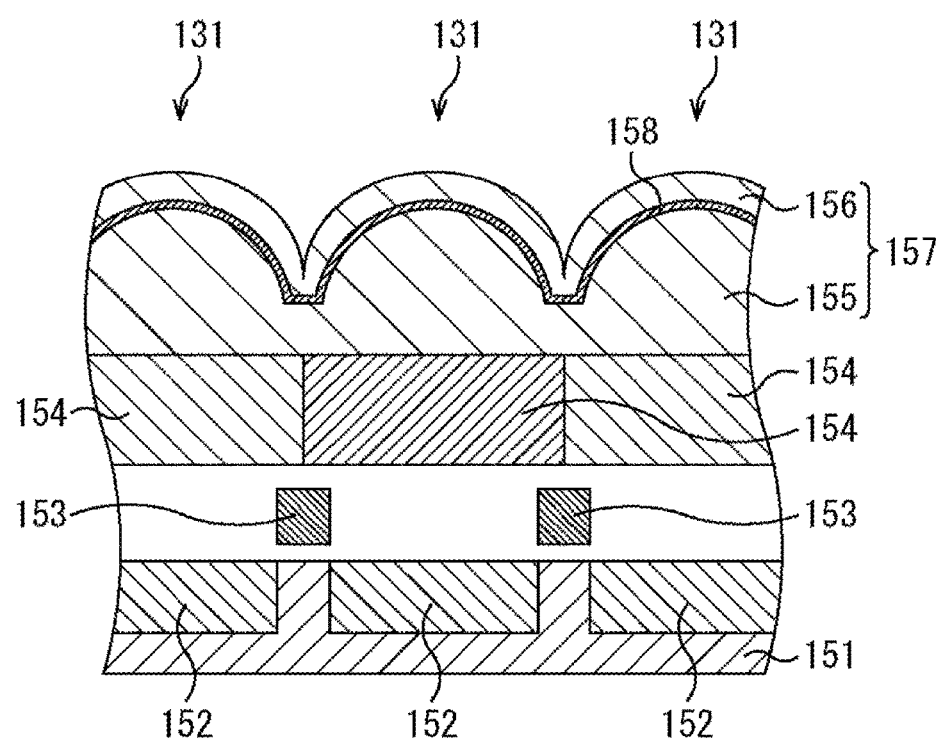
FIG. 4 is a cross-sectional view showing a configuration example of pixels according to a first embodiment of the present technology.

FIG. 4 is a cross-sectional view showing a configuration example of pixels in the CMOS image sensor 10 according to a first embodiment.

As shown in FIG. 4, in pixels 131, photoelectric conversion units 152 that receive incident light and perform photoelectric conversion are formed on a semiconductor substrate 151, and a wiring layer 153 including Cu and Al is formed on upper layer of the semiconductor substrate 151.

Over the wiring layer 153, a color filter layer 154 having spectral characteristics corresponding to each pixel 131 is formed for the every pixel 131, and microlenses 157 are formed over the color filter layer 154 by laminating a first lens layer 155 and a second lens layer 156.

The first lens layer 155 and the second lens layer 156 are formed of an inorganic material. Specifically, the first lens layer 155 and the second lens layer 156 are formed of SiN.

Between the first lens layer 155 and the second lens layer 156, an oxide film 158 having a uniform film thickness is formed. The oxide film 158 has a refractive index lower than refractive indexes of the first lens layer 155 and the second lens layer 156.

According to the configuration of this embodiment, in the solid-state imaging device including the microlenses formed by laminating the plurality of lens layers, the oxide film 158 having a uniform film thickness is intentionally formed between the lens layers, it is possible to prevent the sensitivity unevenness from generating in whole pixels.

Figure 5:
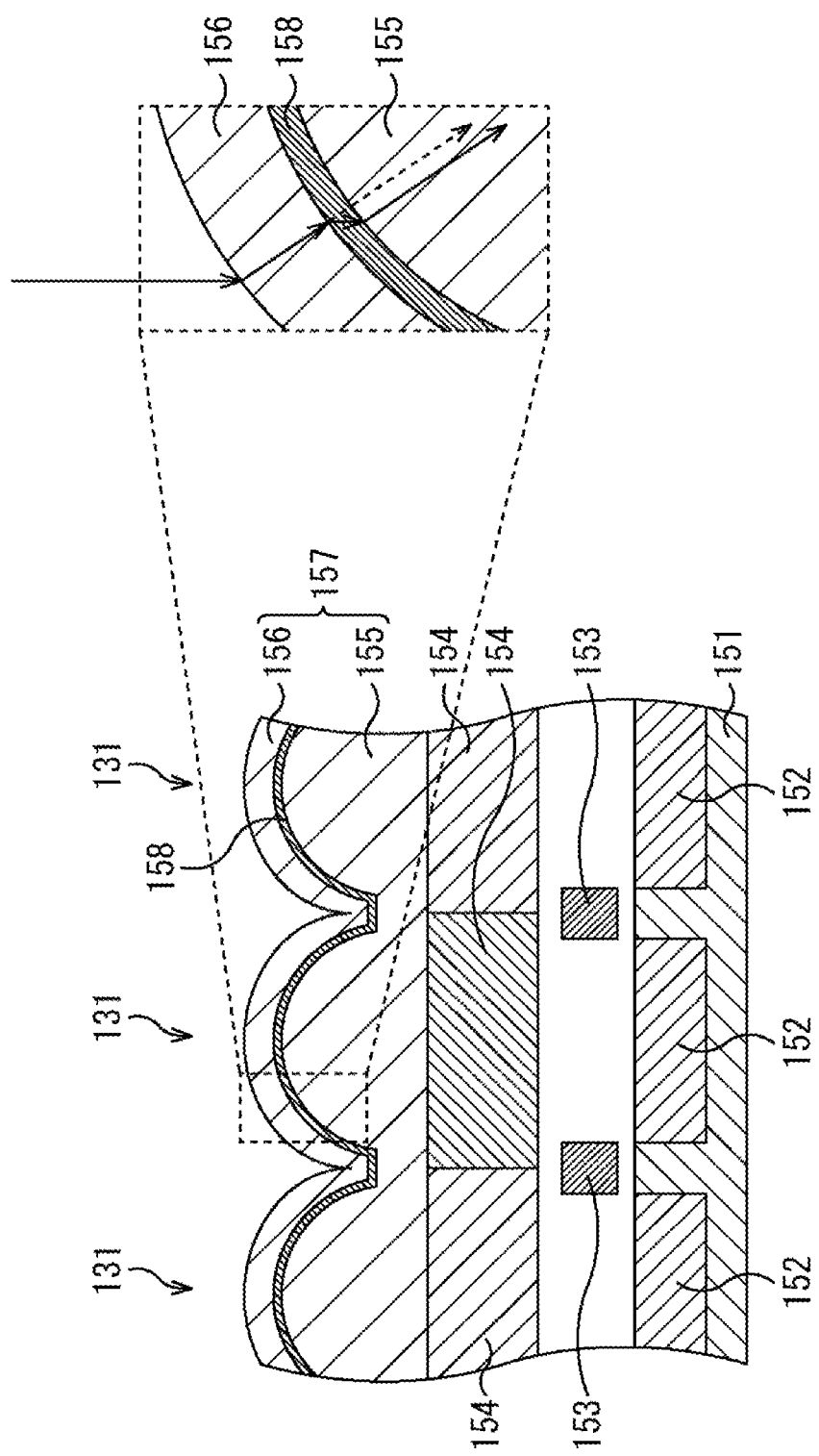
FIG. 5 is a view for illustrating a light-concentrating point in a solid-state imaging device according to the present technology.

By setting the refractive index of the oxide film 158 to lower than the refractive index of the lens layer, as shown in FIG. 5, the light-concentrating point of the incident light from the microlens 157 can be decreased. In this manner, it is possible to match the light-concentrating point with the light receiving surface of the photoelectric conversion unit 152 even when it falls into the front focus state.

<Flow of Pixel Formation>

Figure 6:
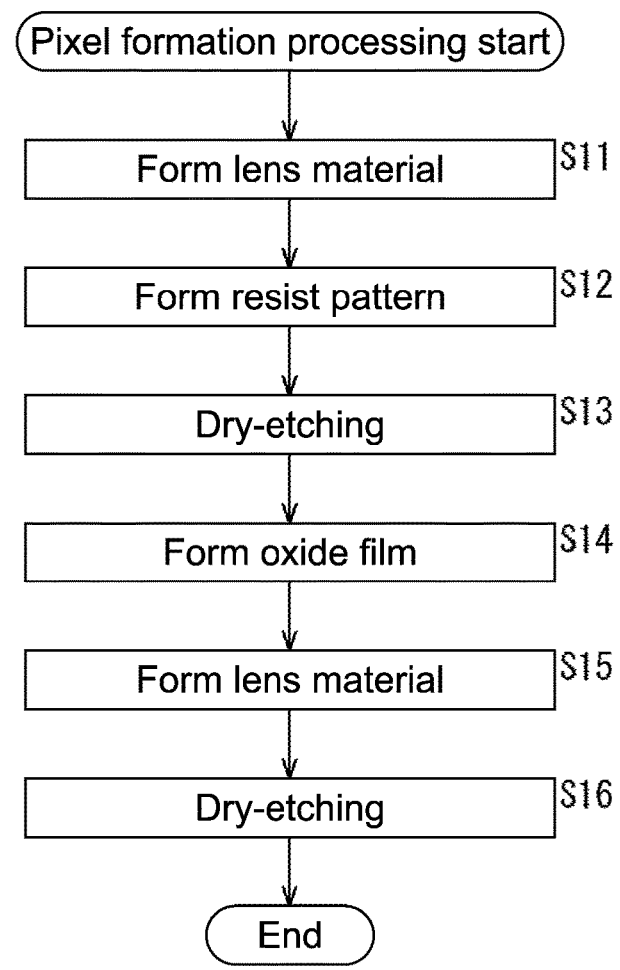
FIG. 6 is a flowchart for illustrating pixel formation processing.

Next, referring to FIG. 6 to FIG. 8, a flow of the pixel formation according to this embodiment will be described. FIG. 6 is a flowchart for illustrating the pixel formation processing, and FIG. 7 and FIG. 8 are cross-sectional views for showing a process of the pixel formation.

Hereinafter, processing after the color filter layer 154 is formed will be described.

Figure 7:
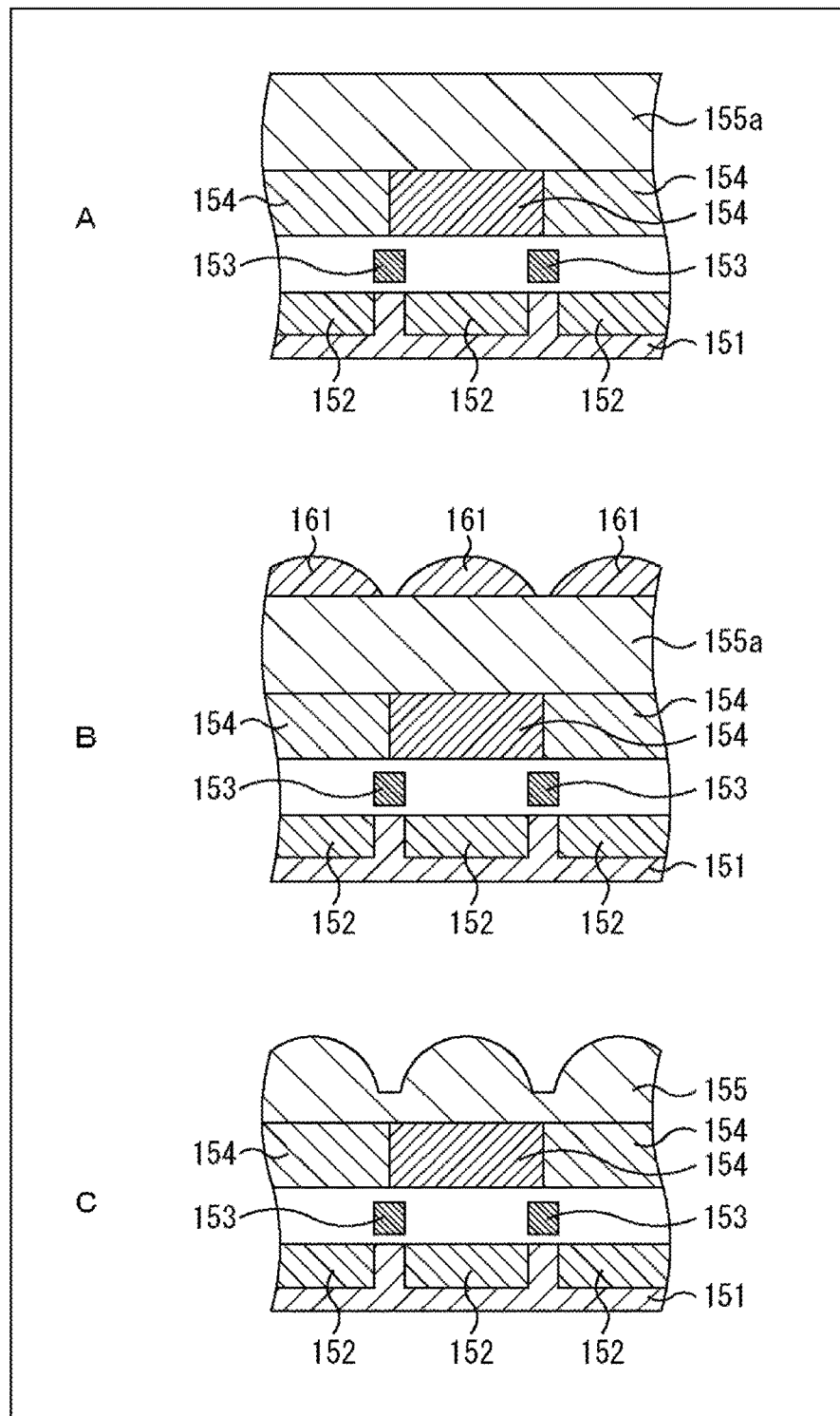
FIG. 7 are views for illustrating a process of pixel formation.
Figure 8:
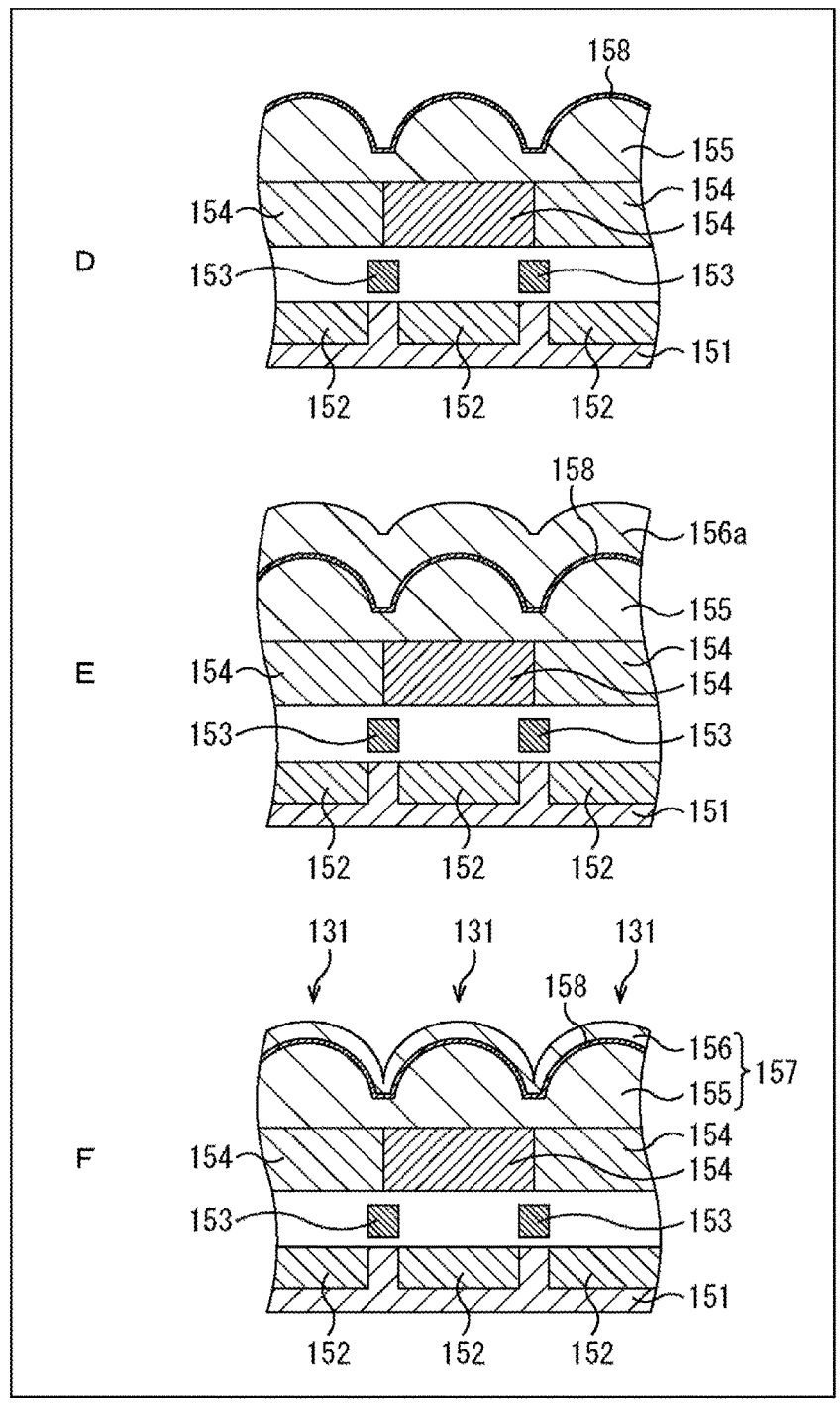
FIG. 8 are views for illustrating a process of pixel formation.

In Step S11, as shown in "A" of FIG. 7, a lens material 155a including SiN is formed on the color filter layer 154.

In Step S12, as shown in "B" of FIG. 7, a resist pattern 161 is formed for every pixel on the lens material 155a by a photolithography method.

In Step S13, the resist pattern 161 is etched transfer to the lens material 155a to perform dry etching. In this manner, as shown in "C" of FIG. 7, the first lens layer 155 having lens shapes for respective pixels is formed.

In Step S14, as shown in "D" of FIG. 8, the oxide film 158 having a uniform film thickness is formed on the first lens layer 155 formed for the respective pixels. Specifically, an oxide film is grown on the surface of the first lens layer 155 using oxygen plasma to form the oxide film 158. Other than using oxygen plasma, a CVD (Chemical Vapor Deposition) method or a sputtering method may be used to form the oxide film 158.

In Step S15, as shown in "E" in FIG. 8, the lens material 156a including SiN is formed on the oxide film 158. The lens material 156a is formed along the lens shapes of the first lens layer 155 and the oxide film 158.

In Step S16, the lens material 156a is dry etched to form the second lens layer 156, as shown in "F" of FIG. 8. In this manner, the microlenses 157 where the first lens layer 155 and the second lens layer 156 are laminated for respective capturing pixels 131 are formed.

In this manner, the pixels 131 are formed.

By the above-described processing, in the production process of the solid-state imaging device including the plurality of lens where the layers are laminated and formed, the oxide film having a uniform film thickness is intentionally formed between the lens layers, it is possible to prevent the sensitivity unevenness from generating in whole pixels.

In the above, the microlens is formed by laminating two lens layers. Note that three or more of the lens layers may be laminated and formed.

<Configuration Example of Pixels According to Second Embodiment>

Figure 9:
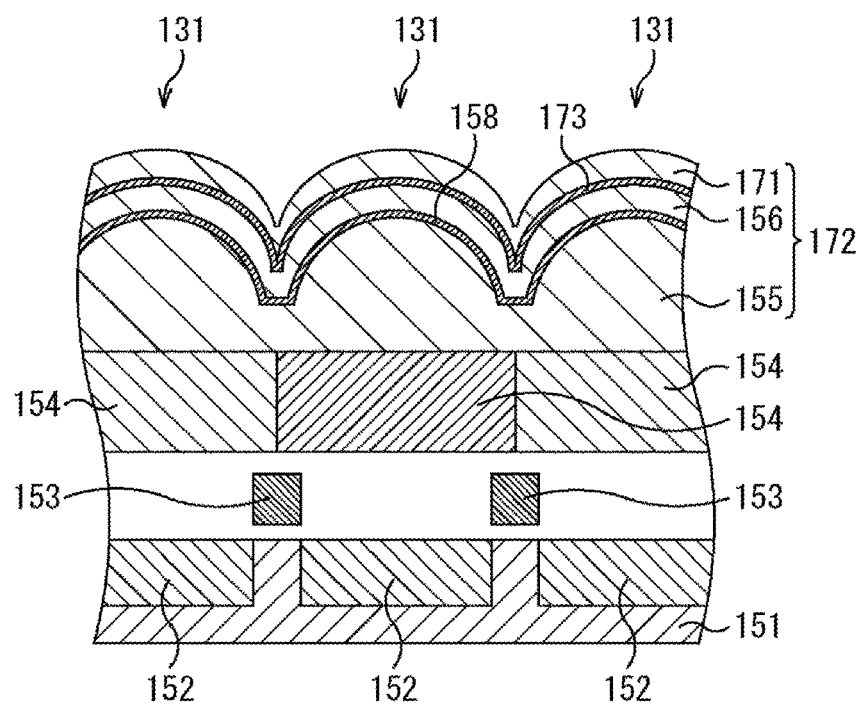
FIG. 9 is a cross-sectional view showing a configuration example of pixels according to a second embodiment of the present technology.

FIG. 9 shows a configuration example of pixels according to a second embodiment.

The parts formed by the pixels 131 shown in FIG. 9 similar to those formed by the pixels 131 shown in FIG. 4 are omitted from the description.

As shown in FIG. 9, in the pixels 131, microlenses 172 are formed by laminating the first lens layer 155, the second lens layer 156, and a third lens layer 171 for the respective pixels 131.

The third lens layer 171 is formed of SiN similar to the first lens layer 155 and the second lens layer 156.

An oxide film 173 having a uniform film thickness is formed between the second lens layer 156 and the third lens layer 171 similar to the oxide film 158 formed between the first lens layer 155 and the second lens layer 156. The oxide film 173 also has a refractive index lower than the refractive index of each of the first lens layer 155, the second lens layer 156, and the third lens layer 171.

Also in this embodiment, in the solid-state imaging device including the microlenses formed by laminating the plurality of lens layers, as the oxide films 158, 173 having a uniform film thickness are intentionally formed between the lens layers, it is possible to prevent the sensitivity unevenness from generating in whole pixels.

Also, by setting the refractive index of the oxide film 158 to lower than the refractive index of the lens layer, as shown in FIG. 5, the light-concentrating point of the incident light from the microlens 172 can be decreased. In this manner, it is possible to match the light-concentrating point with the light receiving surface of the photoelectric conversion unit 152 even when it falls into the front focus state.

In the above, the microlens is formed by laminating three lens layers. Note that four or more of the lens layers may be laminated and formed.

As a flow of the pixel formation in this embodiment is basically similar to the flow of the pixel formation described referring to FIG. 6 to FIG. 8 except that the processing in Steps S14 to S16 of the flowchart in FIG. 6 is repeated for the number of lens layers laminated, the description is omitted.

As above, the microlens is formed by laminating the plurality of lens layers including the same material, but may be formed by laminating the plurality of lens layers including different materials.

<Configuration Example of Pixels According to Third Embodiment>

Figure 10:
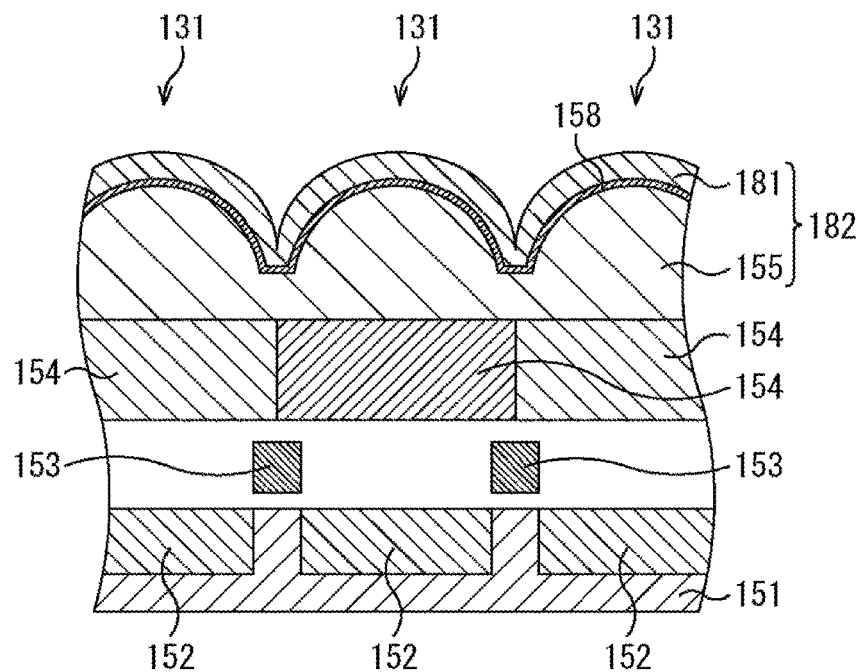
FIG. 10 is a cross-sectional view showing a configuration example of pixels according to a third embodiment of the present technology.

FIG. 10 shows a configuration example of pixels according to a third embodiment.

The parts formed by the pixels 131 shown in FIG. 10 similar to those formed by the pixels 131 shown in FIG. 4 are omitted from the description.

As shown in FIG. 10, in the pixels 131, the first lens layer 155 and the second lens layer 181 are laminated for the every pixel 131 to form a microlens 182.

The second lens layer 181 is formed of an inorganic material different from the first lens layer 155. Specifically, the second lens layer 181 is formed of SiON having a refractive index difference between SiON and the oxide film 158 being lower than that between SiN and the oxide film 158.

According to this embodiment, the operation and effect are exerted similar to the above-described embodiments. In addition, as the second lens layer 181 is formed of SiON having a refractive index difference between SiON and the oxide film 158 being lower than that between SiN and the oxide film 158, total reflection at a boundary between the oxide film 158 and the second lens layer 181 can be decreased, whereby it is possible to prevent a sensitivity from decreasing.

In the above description, the microlens is formed by laminating two lens layers. When the microlens is formed by laminating three or more lens layers, all lens layers laminated on the upper layer of the oxide film are formed of SiON, for example.

<Configuration Example of Pixels According to Fourth Embodiment>

Figure 11:
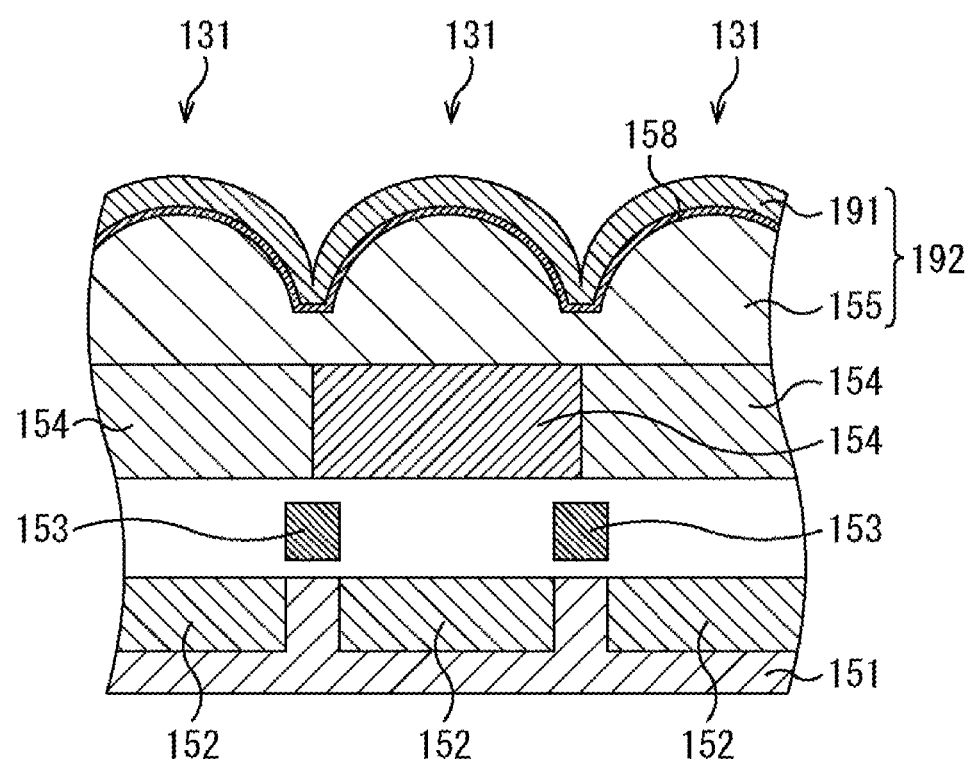
FIG. 11 is a cross-sectional view showing a configuration example of pixels according to a fourth embodiment of the present technology.

FIG. 11 shows a configuration example of pixels according to a fourth embodiment.

The parts formed by the pixels 131 shown in FIG. 11 similar to those formed by the pixels 131 shown in FIG. 4 are omitted from the description.

As shown in FIG. 11, in the pixels 131, the first lens layer 155 and the second lens layer 191 are laminated for the every pixel 131 to form a microlens 192.

The second lens layer 191 is formed of an organic material different from the first lens layer 155.

According to this embodiment, the operation and effect are exerted similar to the above-described embodiments, too.

In the above description, the microlens is formed by laminating two lens layers. When the microlens is formed by laminating three or more lens layers, all lens layers laminated on the upper layer of the oxide film are formed of an organic material, for example.

<Configuration Example of Electronic Apparatus>

Next, referring to FIG. 12, a configuration example of an electronic apparatus to which the present technology is applied will be described.

Figure 12:
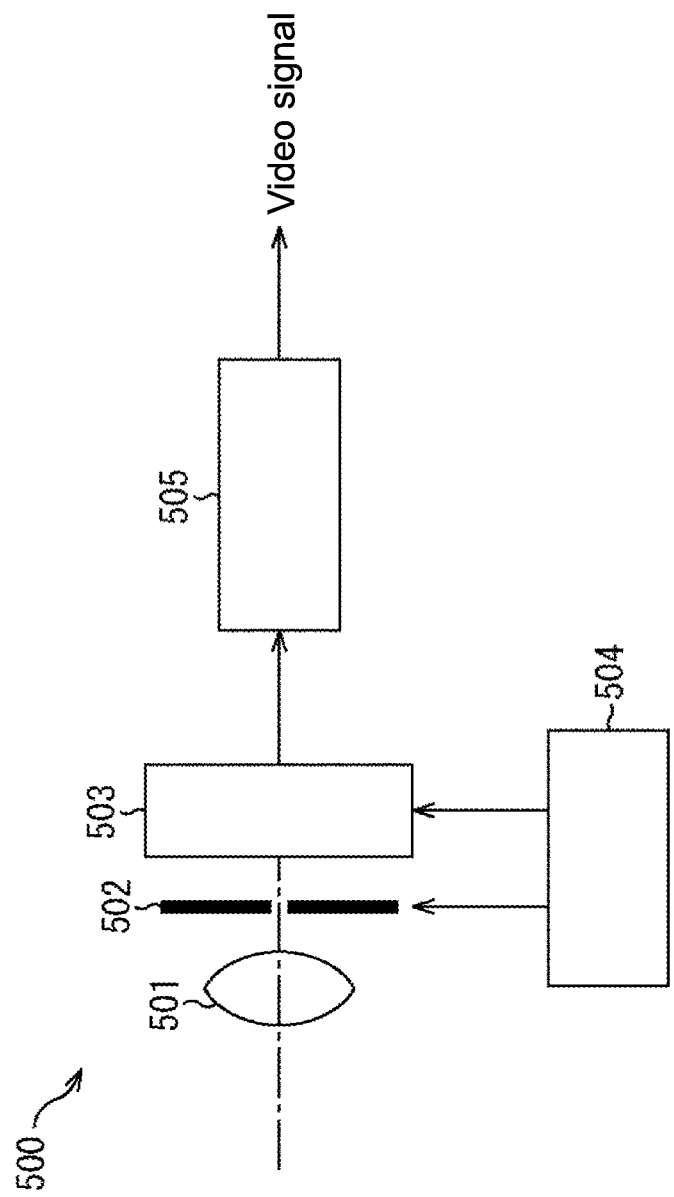
FIG. 12 is a block diagram showing a configuration example of an electronic apparatus to which the present technology is applied.

An electronic apparatus 500 shown in FIG. 12 includes an optical lens 501, a shutter apparatus 502, a solid-state imaging device 503, a driving circuit 504, and a signal processing circuit 505. FIG. 12 shows the configuration that the CMOS image sensor 10 having the pixels in the above-described embodiment is disposed at an electronic apparatus (for example, digital still camera) as the solid-state imaging device 503.

The optical lens 501 captures image light (incident light) from an object to be imaged on an imaging surface of the solid-state imaging device 503. In this manner, a signal charge is accumulated for a certain period of time within the solid-state imaging device 503. The shutter apparatus 502 controls a light irradiation period and a light shield period for the solid-state imaging device 503.

The driving circuit 504 supplies the driving signal that controls a signal transfer operation of the solid-state imaging device 503 and a shutter operation of the shutter apparatus 502. By the driving signal (timing signal) supplied from the driving circuit 504, the solid-state imaging device 503 performs a signal transfer. The signal processing circuit 505 performs a variety of signal processing to the signal output from the solid-state imaging device 503. A video signal on which the signal processing is performed is stored in a storage medium such as a memory or is output to a monitor.

Furthermore, the electronic apparatus 500 includes a lens driving unit (not shown) that drives the optical lens 501 in its light axis direction. The lens driving unit configures a focus mechanism that performs a focus adjustment together with the optical lens 501. In the electronic apparatus 500, a variety of controls such as a control of the focus mechanism and a control of the above-described respective components are performed by a system controller (not shown).

In the electronic apparatus 500 according to the embodiment of the present technology, sensitivity unevenness can be prevented from generating in the solid-state imaging device 503. As a result, an image quality is improved.

The embodiments of the present technology are not limited to the above-described embodiments, and any modification is possible without departing from the scope of the present technology.

The present technology may have the following configurations.

(1) A solid-state imaging device, including:
a pixel array unit having a plurality of pixels;
a microlens formed by laminating a plurality of lens layers for the every pixel; and a film having a uniform film thickness formed between the lens layers.

(2) The solid-state imaging device according to (1), in which
the film is an oxide film.

(3) The solid-state imaging device according to (1) or (2), in which
the film has a refractive index lower than a refractive index of the lens layer.

(4) The solid-state imaging device according to any one of (1) to (3), in which
the lens layer is formed of an inorganic material.

(5) The solid-state imaging device according to (4), in which
the lens layer is formed of SiN.

(6) The solid-state imaging device according to (4), in which
a lower layer that is a first lens layer among the plurality of lens layers is formed of SiN, and an upper layer that is a second lens layer is formed of SiON.

(7) The solid-state imaging device according to any one of (1) to (3), in which
a lower layer that is a first lens layer among the plurality of lens layers is formed of an inorganic material, and an upper layer that is a second lens layer is formed of an organic material.

(8) A method of producing a solid-state imaging device including a pixel array unit having a plurality of pixels, including the steps of:
forming a microlens by laminating a plurality of lens layers for the every pixel; and
forming a film having a uniform film thickness.

(9) An electronic apparatus, including:
a solid-state imaging device including
a pixel array unit having a plurality of pixels,
a microlens formed by laminating a plurality of lens layers for the every pixel, and
a film having a uniform film thickness formed between the lens layers.

DESCRIPTION OF SYMBOLS

10 CMOS image sensor
11 pixel array unit
131 pixel
151 semiconductor substrate
152 photoelectric conversion unit
155 first lens layer
156 second lens layer
157 microlens
158 oxide film
500 electronic apparatus
503 solid-state imaging device

What is claimed is:
1. A solid-state imaging device imaging device, comprising:
a pixel array unit having a plurality of pixels, each pixel including:
a color filter;
a photoelectric conversion unit;
a microlens formed by laminating a plurality of lens layers;
a first film having a uniform film thickness formed between a first lens layer of the plurality of lens layers and a second lens layer of the plurality of lens layers; and
a second film having a uniform film thickness and formed between the second lens layer and a third lens layer in the plurality of lens layers,
wherein the first film and the first lens layer include curved portions that conform to one another,
wherein the second film and the second lens layer include curved portions that conform to one another,
wherein light incident to the color filter passes through the plurality of lens layers, the first film, and the second film,
wherein the first lens layer is closer to the photoelectric conversion unit than the second lens layer,
wherein the first lens layer is thicker than the second lens layer,
wherein the second film has a lower refractive index than the plurality of lens layers, and
wherein the first film and the second film have a same refractive index.

2. The solid-state imaging device according to claim 1, wherein the first film is an oxide film.

3. The solid-state imaging device according to claim 2, wherein the plurality of lens layers are formed of an inorganic material.

4. The solid-state imaging device according to claim 3, wherein the plurality of lens layers are formed of SiN.

5. The solid-state imaging device according to claim 3, wherein the first lens layer is formed of SiN, and the second lens layer is formed of SiON.

6. The solid-state imaging device according to claim 1, wherein the first lens layer is formed of an inorganic material, and is the second lens layer is formed of an organic material.

7. The solid-state imaging device according to claim 1, wherein the first film and the second film have a same uniform film thickness.

8. A method of producing a solid-state imaging device including a pixel array unit having a plurality of pixels, comprising:
forming color filters on a substrate;
forming microlenses on the color filters by laminating a plurality of lens layers;
forming a first film between a first lens layer of the plurality of lens layers and a second lens layer of the plurality of lens layers, the film having a uniform film thickness; and
forming a second film having a uniform thickness between the second lens layer and a third lens layer of the plurality of lens layers,
wherein the forming the microlens and the forming the first and second films are performed such that:
light incident to the color filters passes through the plurality of lens layers, the first film, and the second film,
the first film and the first lens layer include curved portions that conform to one another,
the second film and the second lens layer include curved portions that conform to one another,
the first lens layer is closer to photoelectric conversion units of the plurality of pixels than the second lens layer, and
the first lens layer is thicker than the second lens layer,
wherein the second film has a lower refractive index than the plurality of lens layers, and
wherein the first film and the second film have a same refractive index.

9. An electronic apparatus, comprising:
a solid-state imaging device including:

a pixel array unit having a plurality of pixels, each pixel including:
- a color filter:
- a photoelectric conversion unit:
- a microlens formed by laminating a plurality of lens layers;
- a first film having a uniform film thickness formed between a first lens layer of the plurality of lens layers and a second lens layer of the plurality of lens layers, wherein the first film and the plurality of lens layers include curved portions that conform to one another; and
- a second film having a uniform film thickness formed between the second lens layer and a third lens layer of the plurality of lens layers, wherein the second film and the second lens layer include curved portions that conform to one another, wherein light incident to the color filter passes through the plurality of lens layers, the first film, and the second film, wherein the first lens layer is closer to the photoelectric conversion units than the second lens layer, wherein the first lens layer is thicker than the second lens layer, wherein the second film has a lower refractive index than the plurality of lens layers, and wherein the first film and the second film have a same refractive index.

* * * * *